(12) United States Patent
Slaton et al.

(10) Patent No.: US 8,091,224 B2
(45) Date of Patent: Jan. 10, 2012

(54) METHOD FOR COUPLING A BATTERY WITHIN AN EMBEDDED SYSTEM

(75) Inventors: David S. Slaton, Huntsville, AL (US); David L. McDonald, Lacey's Spring, AL (US); Shreenath S. Perlaguri, Andhra Pradesh (IN)

(73) Assignee: GE Intelligent Platforms Embedded Systems, Inc., Charlottesville, VA (US)

( * ) Notice: Subject to any disclaimer, the term of this patent is extended or adjusted under 35 U.S.C. 154(b) by 350 days.

(21) Appl. No.: 12/246,200

(22) Filed: Oct. 6, 2008

(65) Prior Publication Data
US 2010/0083497 A1   Apr. 8, 2010

(51) Int. Cl.
*H01R 43/00* (2006.01)
*H01R 4/42* (2006.01)
(52) U.S. Cl. ............. 29/857; 29/623.1; 29/832; 29/845; 29/858; 29/874; 439/762

(58) Field of Classification Search .................... 29/857, 29/858, 874, 863, 845, 832, 623.1; 439/762, 439/500, 504, 73; 361/750, 761, 767, 768, 361/769, 388, 522, 504; 257/678, 679, 691
See application file for complete search history.

(56) References Cited

U.S. PATENT DOCUMENTS

| 5,294,829 | A  | * | 3/1994 | Hundt | ............................ | 257/678 |
| 5,552,240 | A  | * | 9/1996 | Derstine | .......................... | 429/96 |
| 5,796,588 | A  | * | 8/1998 | Machida et al. | ............... | 361/773 |
| 6,062,901 | A  | * | 5/2000 | Liu et al. | ........................ | 439/500 |
| 6,077,106 | A  | * | 6/2000 | Mish | ............................... | 439/500 |
| 6,722,916 | B2 | * | 4/2004 | Buccinna et al. | .............. | 439/500 |
| 6,904,482 | B2 | * | 6/2005 | Rietze et al. | ................... | 710/107 |

* cited by examiner

*Primary Examiner* — Derris Banks
*Assistant Examiner* — Tai Nguyen
(74) *Attorney, Agent, or Firm* — GE Global Patent Operation; Catherine J. Toppin

(57) ABSTRACT

A method for coupling a battery within an embedded system is described. The method includes creating a hole extending through a printed circuit board (PCB), inserting a portion of the battery into the hole, and electrically coupling the battery to at least one contact.

18 Claims, 9 Drawing Sheets

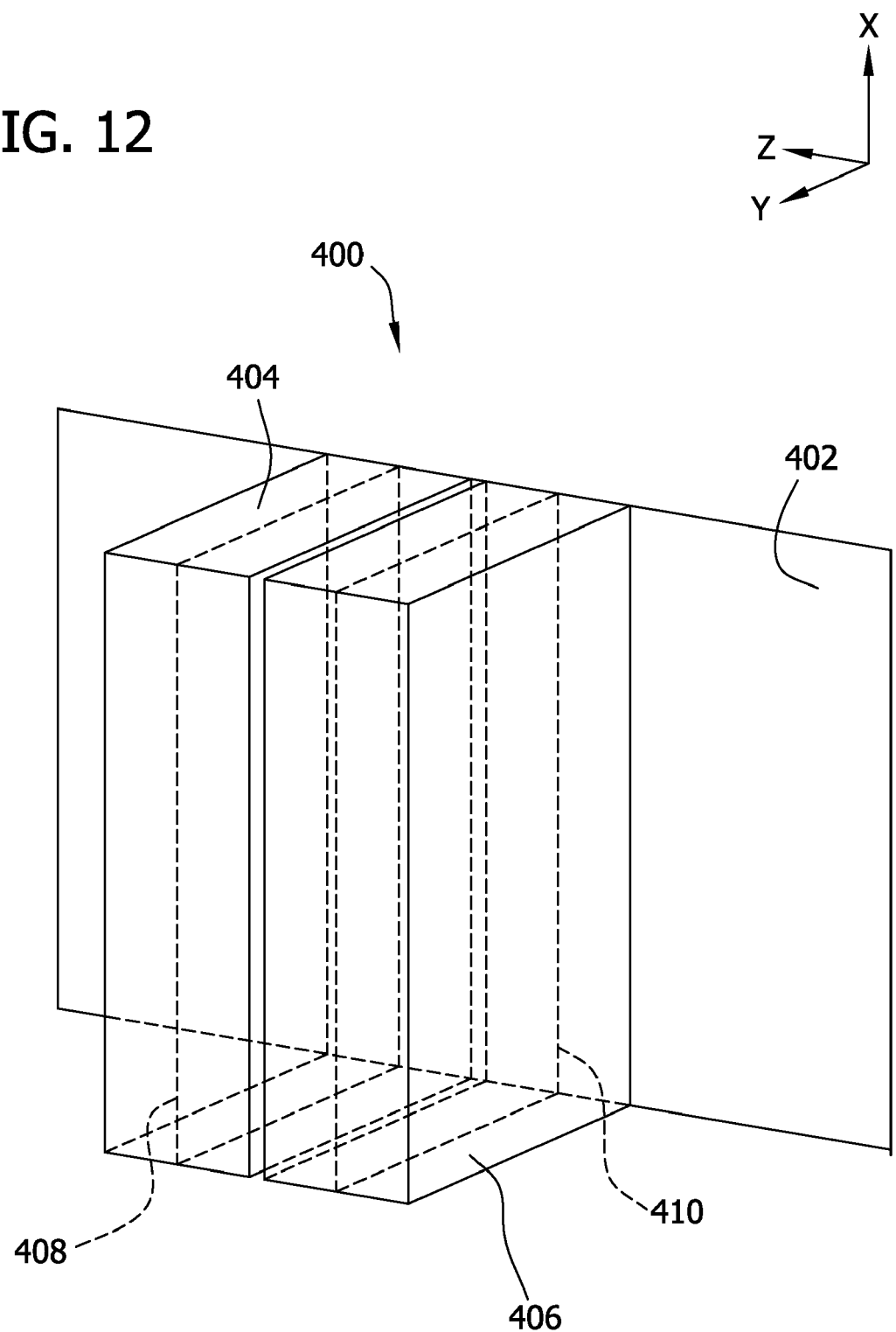

US 8,091,224 B2

METHOD FOR COUPLING A BATTERY WITHIN AN EMBEDDED SYSTEM

FIELD OF THE INVENTION

The field of the invention relates generally to embedded systems and more particularly to systems and a method for coupling a battery within an embedded system.

BRIEF DESCRIPTION OF THE INVENTION

As the size and complexity of software and computer-related tasks grow, an ability of at least some known computers to handle the requirements associated with the software diminishes. More specifically, known computers are implemented on a printed circuit board and within a housing. Moreover, known computers are assigned a pre-determined volume based on industry standards. As such, space becomes valuable on the printed circuit boards because the volume is constrained.

Moreover, other electronic components may also be coupled on the printed circuit board. For example, such electronic components may include a computer processor, a switch, a memory, and/or a power supply However, the more electronic components that are coupled to the printed circuit board, generally, the more likely it is that the printed circuit board may become "space-limited". Hence, it is difficult to minimize occupancy of an area by the electronic components on the printed circuit board. Moreover, it may be difficult to fit the electronic components within a volume of the housing.

BRIEF DESCRIPTION OF THE INVENTION

In one aspect, a method for coupling a battery within an embedded system is described. The method includes creating a hole extending through a printed circuit board (PCB), inserting a portion of the battery into the hole, and electrically coupling the battery to at least one contact.

In another aspect, a system for coupling a battery within an embedded system is described. The system includes a battery configured to provide power, and a printed circuit board (PCB) comprising at least one hole extending through the PCB. A portion of the battery is configured to be inserted into the hole.

In yet another aspect, an embedded system is described. The embedded system includes a modular housing. The modular housing includes a printed circuit board (PCB) further including a hole extending through the PCB. The embedded system further includes a battery having a portion configured to be inserted into the hole.

BRIEF DESCRIPTION OF THE DRAWINGS

FIG. 12 is a perspective view of an embodiment of an embedded system.

DETAILED DESCRIPTION OF THE INVENTION

Figure 1:
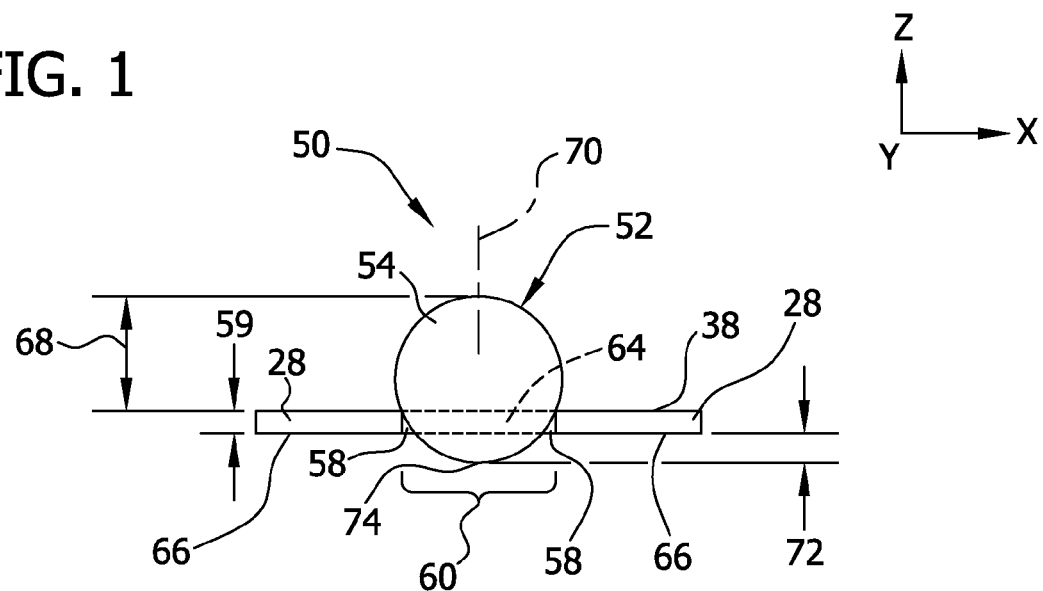
FIG. 1 is a side-view of an alternative embodiment of a system for use in coupling a battery within an embedded system.
Figure 2:
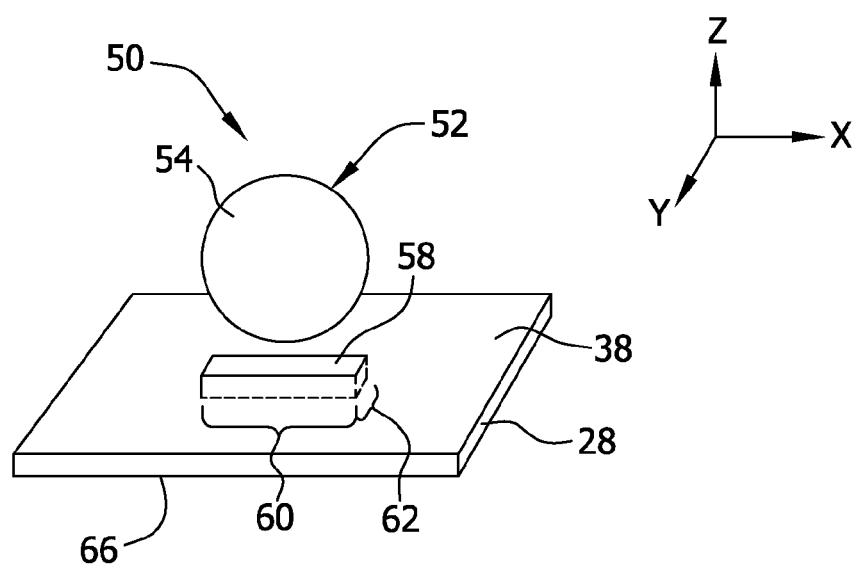
FIG. 2 is a perspective view of the system shown in FIG. 1.

FIG. 1 is a side-view of a system 50 for use in coupling a battery 52 within an embedded system (not shown in FIG. 1). FIG. 2 is a perspective view of system 50. In the exemplary embodiment, system 50 includes a PCB 28 and a battery 52. In the exemplary alternative embodiment, battery 52 is a coin cell having a diameter ranging from about 14 millimeters (mm) to about 18 mm. Alternatively, battery 52 is a coin cell having a diameter of more than about 18 mm or less than about 14 mm. Battery 52 has a positive terminal 54 and a negative terminal 56.

In the exemplary embodiment, a hole 58 extends through PCB 28 such that a depth of hole 58 measured along a Z-axis of hole 58 is the same as a thickness 59, measured along the Z-axis, of PCB 28. In one embodiment, hole 58 has a cross-sectional area on the X-Y plane ranging from between about 0.19 inch$^2$ to 0.31 inch$^2$. Moreover, in the exemplary embodiment, hole 58 has a length 60, ranging from about 12.5 mm to about 14.5 mm, and a width 62, extending substantially parallel to the Y-axis, ranging from about 1 mm to about 3 mm. In another example, hole 58 has a length 60 that is smaller than a diameter of battery 52 and has width 62 that is slightly longer than a thickness of battery 52. In the exemplary embodiment, a portion 64, indicated between dotted lines, of battery 52 extends through PCB hole 58 from a top surface 38 of PCB 28 to a bottom surface 66 of PCB 28. When portion 64 extends through hole 58, battery 52 is oriented substantially perpendicularly with respect to top surface 38. In the exemplary embodiment, bottom surface 66 is substantially parallel to top surface 38.

Battery 52 is positioned in a desired location relative to hole 58. For example, when battery 52 is positioned within hole 58, battery 52 extends a distance 68 from top surface 38 and a point 70 on a circumference of battery 52. Additionally, a portion 64 extends a distance 72 from bottom surface 66 and a point 74 on circumference of battery 52. For example, in one embodiment, of the distance 68 is about 0.54 inches and the distance 72 is between about 0.06 inches and about 0.075 inches. In the exemplary embodiment, when portion 64 extends through hole 58, battery 52 is originated substantially perpendicularly with respect to top surface 38. Moreover, when portion 64 is extended through hole 58, battery 52 is supported within hole 58 such that a likelihood of battery 52 tilting with respect to the Z-axis is facilitated to be reduced.

In another embodiment, a user manually inserts battery 52 within hole 58. For example in another embodiment, hole 58 could be shaped and/or oriented to enable battery 52 to be inserted from any other direction relative to hole 58. In yet another embodiment, battery 52 is originated obliquely with respect to top surface 38. Hole 58 may have any cross-sectional shape or size.

Figure 3:
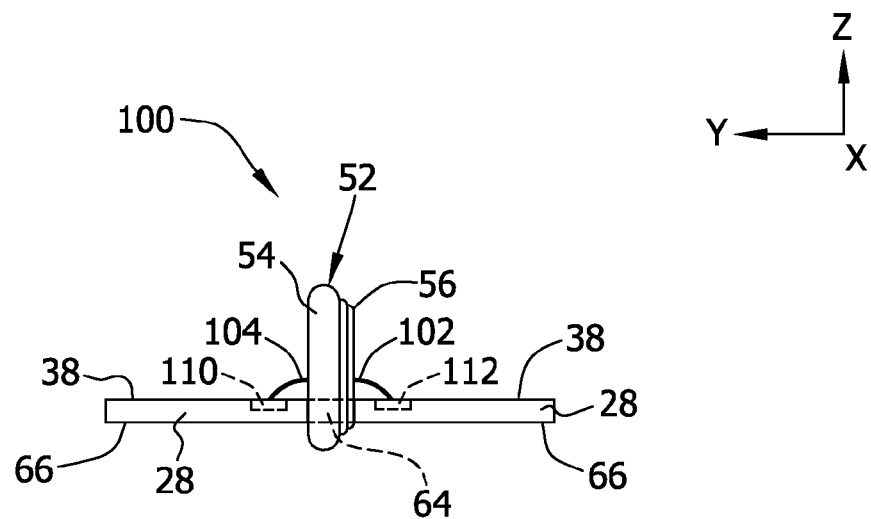
FIG. 3 is a front view an alternative embodiment of a system of a system for use in coupling a battery within an embedded system.
Figure 4:
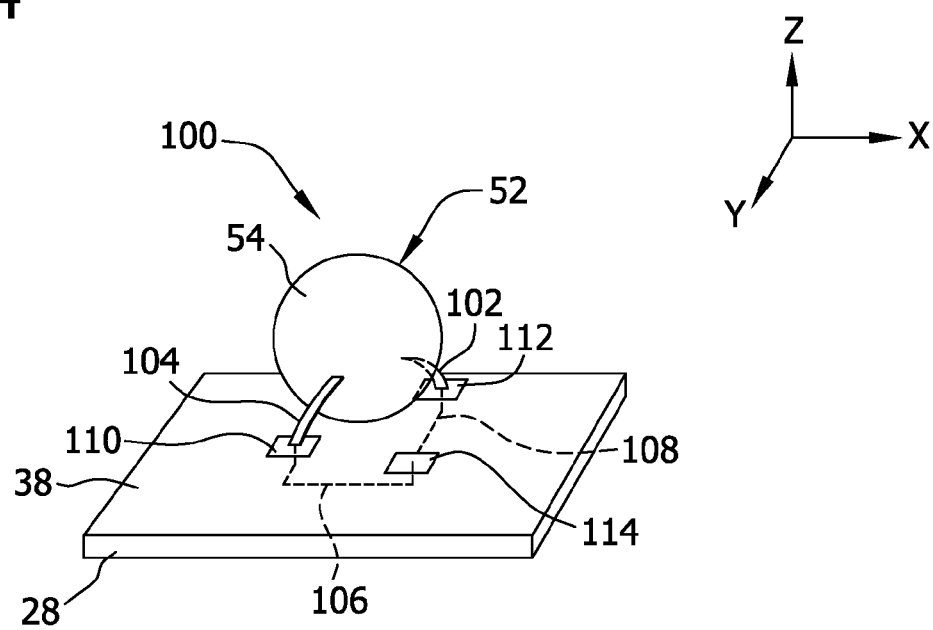
FIG. 4 is a perspective-view of the system shown in FIG. 3.

FIG. 3 is a front-view of an alternative system 100 for use in coupling a battery 52 within an embedded system (not shown in FIG. 3). FIG. 4 is a perspective view of system 100. System 100 includes battery 52, a plurality of contact members 102 and 104, a plurality of wire traces 106 and 108, a plurality of contact pads 110 and 112, and PCB 28. Contact members 102 and 104 are fabricated from a conductive metal. In the exemplary embodiment, a machine (not shown) is used to fabricate contact members 102 and 104. When fabricated, wire traces 106 and 108 are embedded within PCB 28, and contact pads 110 and 112 are embedded within PCB top surface 38. Contact pad 110 is electrically connected to wire trace 106 and wire trace 106 is electrically coupled to an electrical device 114, such as a processor or a memory device. Contact pad 112 is electrically coupled to wire trace 108 and wire trace 108 is electrically coupled to electrical device 114.

After battery 52 is inserted within hole 58, in the exemplary embodiment, adhesive is deposited at specific positions on contact pads 110 and 112, and contact members 102 and 104 are positioned to contact the adhesive deposited on contact pads 110 and 112. Moreover, contact member 104 is positioned to contact positive terminal 54, and contact member 102 is positioned to contact negative terminal 56.

When heated and/or cured, the adhesive facilitates securing contact member 104 to contact pad 110 and contact member 102 to contact pad 112. An electrical connection is established between electrical device 114 and battery 52 after contact member 104 is secured to contact pad 110 and after contact member 102 is secured to contact pad 112. Upon establishing the electrical connection, battery 52 may supply power to electrical device 114. When battery 52 is inserted between contact members 102 and 104, contact member 102 biases battery 52 against contact member 104 to reduce a chance of battery 52 from tilting with respect to the Z-axis. Similarly, when battery 52 is inserted between contact members 102 and 104, contact member 104 biases battery 52 against contact member 102. In an alternative embodiment, contact members 102 and/or 104 are secured with respective contact pads 112 and/or 110 with a mechanical fastener, such as a screw.

Figure 5:
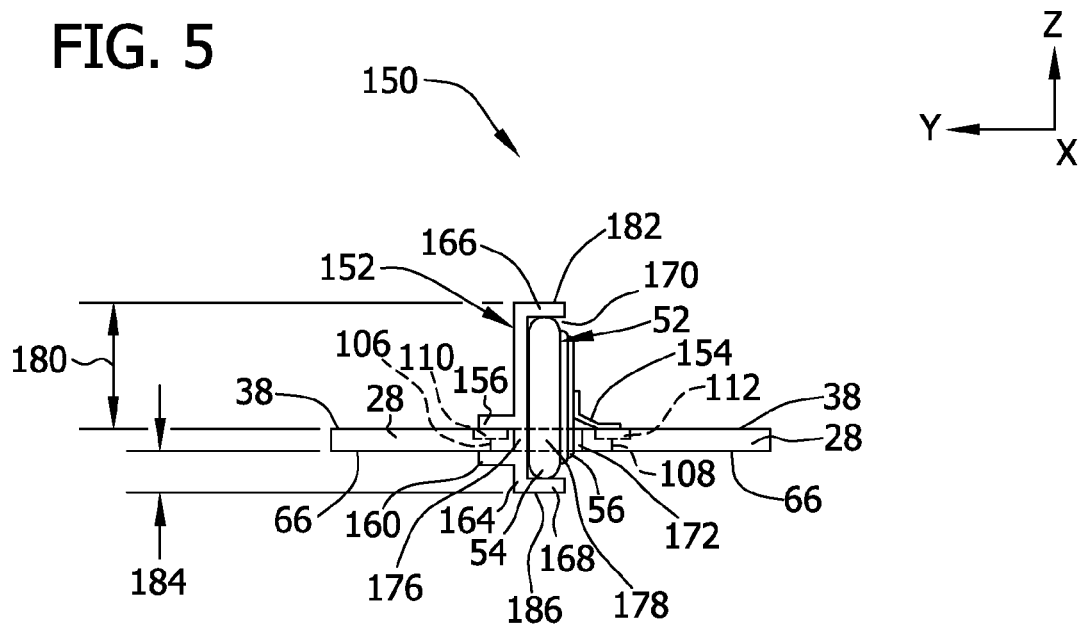
FIG. 5 is a front view of a further alternative embodiment of a system for coupling a battery within an embedded system.
Figure 6:
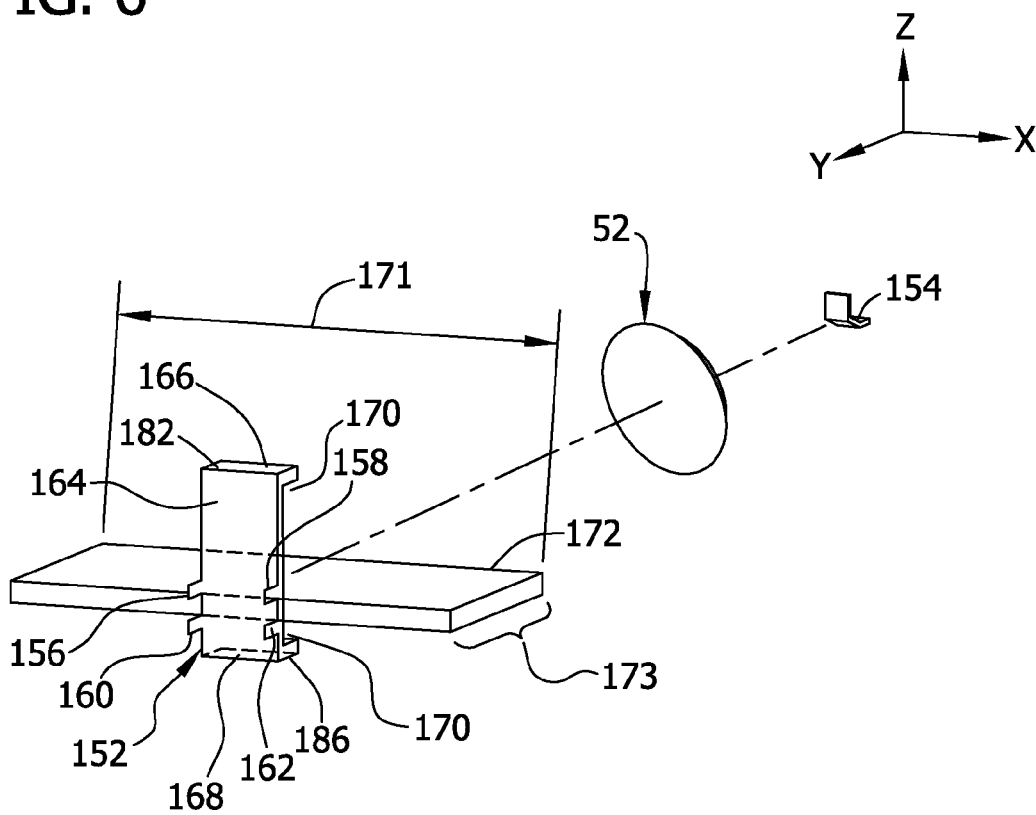
FIG. 6 is a perspective view of an exemplary battery holder and a contact member used with the system shown in FIG. 5.

FIG. 5 is a front-view of an alternative system 150 for use in coupling battery 52 within an embedded system (not shown). FIG. 6 is a perspective view of an exemplary battery holder 152 and a contact member 154 used with system 150. System 150 includes battery holder 152, battery 52, and contact member 154. In the exemplary embodiment, battery holder 152 is fabricated from a conductive metal and includes a plurality of prongs 156, 158, 160, and 162 that are oriented generally parallel to the Y-axis from a body 164 of battery holder 152. Battery holder 152 also includes a plurality of flaps 166 and 168 that extend from body 164 in a direction that is generally opposite from prongs 156, 158, 160, and 162, such that a cavity 170 is defined between flaps 166 and 168. In the exemplary embodiment, a molding machine is used to form battery holder 152.

In the exemplary embodiment, a hole 172 is created within PCB 28. For example, in the exemplary embodiment, a depth of hole 172, is the same as thickness 59 of PCB 28. In the exemplary embodiment, hole 172 has a length 171, measured substantially parallel to the X-axis, that is longer than a diameter of battery 52, and a width 173, measured substantially parallel to the Y-axis, that is wider than a width 62 of battery 52.

Battery holder 152 is inserted in cavity 170 such that prongs 156 and 158 extend above top surface 38 and such that prongs 160 and 162 extend below bottom surface 66. More specifically, in the exemplary embodiment, prongs 156 and 158 are substantively parallel to top surface 38, and prongs 160 and 162 are substantively parallel to bottom surface 66. In the exemplary embodiment, top surface 38 is oriented in the Z-direction, and bottom surface 66 is oriented in a direction opposite to the Z-direction. Moreover, flap 166 is substantially parallel to top surface 38 and flap 168 is substantially parallel to bottom surface 66.

After adhesive is placed on contact pad 112, in the exemplary embodiment, contact member 154 is positioned against contact pad 112, and contact member 154 is positioned in contact with battery negative terminal 56.

After battery holder 152 is positioned such that either prong 156 and/or 158 contacts contact pad 110 and such that contact member 154 contacts contact pad 112, the adhesive is heated/cured to secure prong 156 and/or 158 with contact pad 110 and contact member 154 with contact pad 112. When contact member 154 is secured to contact pad 112 and battery holder 152 is secured to contact pad 110, an electrical connection is established between battery 52 and electrical device 114 such that power may be supplied to electrical device 114. When battery holder 152 is placed with respect to PCB 28, a portion 176, shown between dotted lines, of battery 52 extends through PCB hole 172 and a portion 178, shown between dotted lines, of battery 52 extends through PCB hole 172. Moreover, when portion 176 extends within hole 172, a vertical distance 180 between a top surface 182 of flap 166 and top surface 38 ranges from about 0.34 inch to 0.54 inch and a vertical distance 184 between a bottom surface 186 of flap 168 and bottom surface 66 ranges from about 0.06 inch to 0.09 inch. When portion 176 of battery holder 152 extends within hole 172 and a portion of battery 152 is placed within cavity 170, flap 168 of battery holder 152 supports battery 152 to reduce a chance of battery 52 falling through hole 172. When portion 176 of battery holder 152 extends within hole 172 and a portion of battery 52 is placed within cavity 170, contact member 154 applies a force biased towards battery holder 152 to support battery 52 to reduce a chance of battery 52 tilting with respect to the Z-axis.

In another embodiment, hole 172 is the same size as hole 58 (shown in FIG. 2). In yet another alternative embodiment, prong 160 and/or 162 contacts bottom surface 66 when the prong 160 and/or 162 is substantially parallel to bottom surface 66.

In yet another embodiment, battery holder 152 does not include at least one of prongs 156, 158, 160, and 162. In another alternative embodiment, battery holder 152 includes more or less than four prongs 156, 158, 160, and 162. In another embodiment, battery holder 152 does not include any of prongs 156, 158, 160, and/or 162, and adhesive is used to secure battery holder body 164 with contact pad 110. In another alternative embodiment, contact member 154 is the same as either contact member 102 and/or 104 (shown in FIG. 5).

Figure 7:
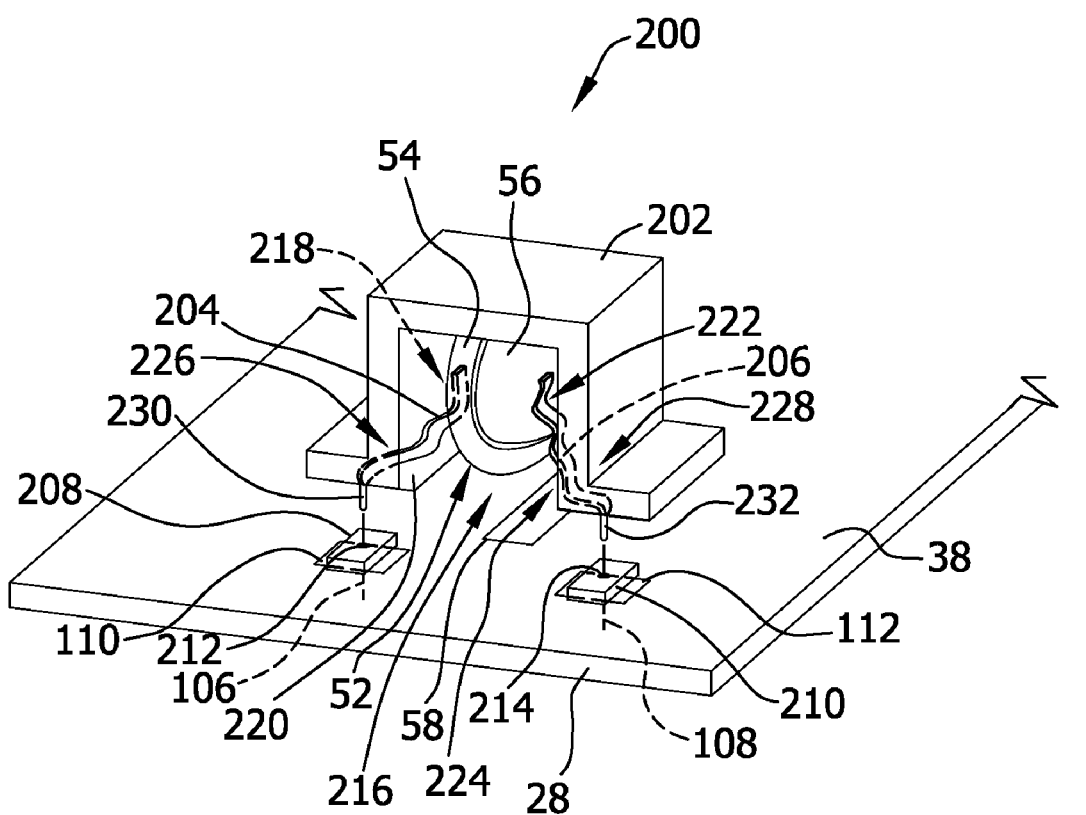
FIG. 7 is a perspective view of yet another alternative embodiment of a system for use in coupling a battery within an embedded system.

FIG. 7 is a perspective view of an exemplary system 200 for use in coupling battery 52 within an embedded system (not shown). System 200 includes a battery cap 202, battery 52, PCB 28, a plurality of contact members 204 and 206, contact pads 110 and 112, and a plurality of contact receptacles 208 and 210. In the exemplary embodiment, hole 58 has a length that is smaller than a diameter of battery 52 and has width that is slightly longer than a thickness of battery 52. In the exemplary embodiment, contact receptacle 208 includes a hole 212 that extends through contact receptacle 208, and contact receptacle 210 includes a hole 214 that extends through contact receptacle 210. For example, in the exemplary embodiment, a depth of hole 212 is the same as a thickness 213 of contact receptacle 208. As another example, a depth of hole 214 is the same as a thickness 215 of contact receptacle 210. Contact receptacles 208 and 210 are coupled to top surface 38 via a contact medium, such as solder or a screw. Each contact member 204 and 206 is fabricated from a conductive metal. Moreover, each contact member 204 and 206 may be formed in a way as to act as a spring. Battery cap 202 includes a cavity 216 sized to receive a portion of battery 52. When fabricated, a portion 218 of contact member 204 extends beyond an internal face 220 of battery cap 202 into cavity 216 and a portion 222 of contact member 206 extends outside an internal face 224 of battery cap 202 into cavity 216. In the exemplary embodiment, each internal face 220 and 224 opposes cavity 216. A portion 226 of contact member 204 remains embedded within battery cap 202 and a portion 228 of contact member 206 remains embedded within battery cap 202. A portion 230 of contact member 204 extends outward battery cap 202 towards PCB top surface 38 and another portion 232 of contact member 206 extends outward battery cap 202 towards top surface 38. In the exemplary embodiment, each portion 230 and 232 is a contact pin. A molding machine, in the exemplary embodiment, is used to fabricate battery cap 202 and to embed portions 226 and 228 within battery cap 202.

After battery 52 is positioned within hole 58, battery cap 202 is positioned such that portion 230 is substantially aligned with hole 212 and such that portion 230 extends through hole 212. Moreover, when battery 52 is positioned within hole 58, battery cap 202 is positioned such that portion 232 is aligned with hole 214 and contact member portion 232 extends through hole 214. Portion 230 extends through hole 212 and contacts with wire trace 106 via contact pad 110. Portion 232 extends through hole 214 and contacts wire trace 108 via contact pad 112.

Moreover, when contact is established between portions 230 and 232 and respective wire traces 106 and 108, contact is established between contact member 204 and positive terminal 54, and between contact member 206 and negative terminal 56. When contact is established between portion 230 and wire trace 106, between portion 232 and wire trace 108, between positive terminal 54 and contact member 204, and between negative terminal 56 and contact member 206, an electrical connection is established between battery 52 and electrical device 114. Moreover, when electrical connection is established between battery 52 and electrical device 114, battery cap 202 supports battery 52 in a generally vertical orientation that is substantially parallel with respect to the Z-axis.

In an alternative embodiment, adhesive is dispensed on contact pad 110 and contact pad 112. Upon placement of battery cap 202, the adhesive is cured to secure portion 230 to contact pad 110 and portion 232 to contact pad 112. When portion 230 is secured to contact pad 110 and portion 232 is secured to contact pad 112, contact member 204 contacts with battery 52, and contact member 206 contacts battery 52, an electrical connection is established between battery 52 and electrical device 114 such that power may be supplied to electrical device 114.

Figure 8:
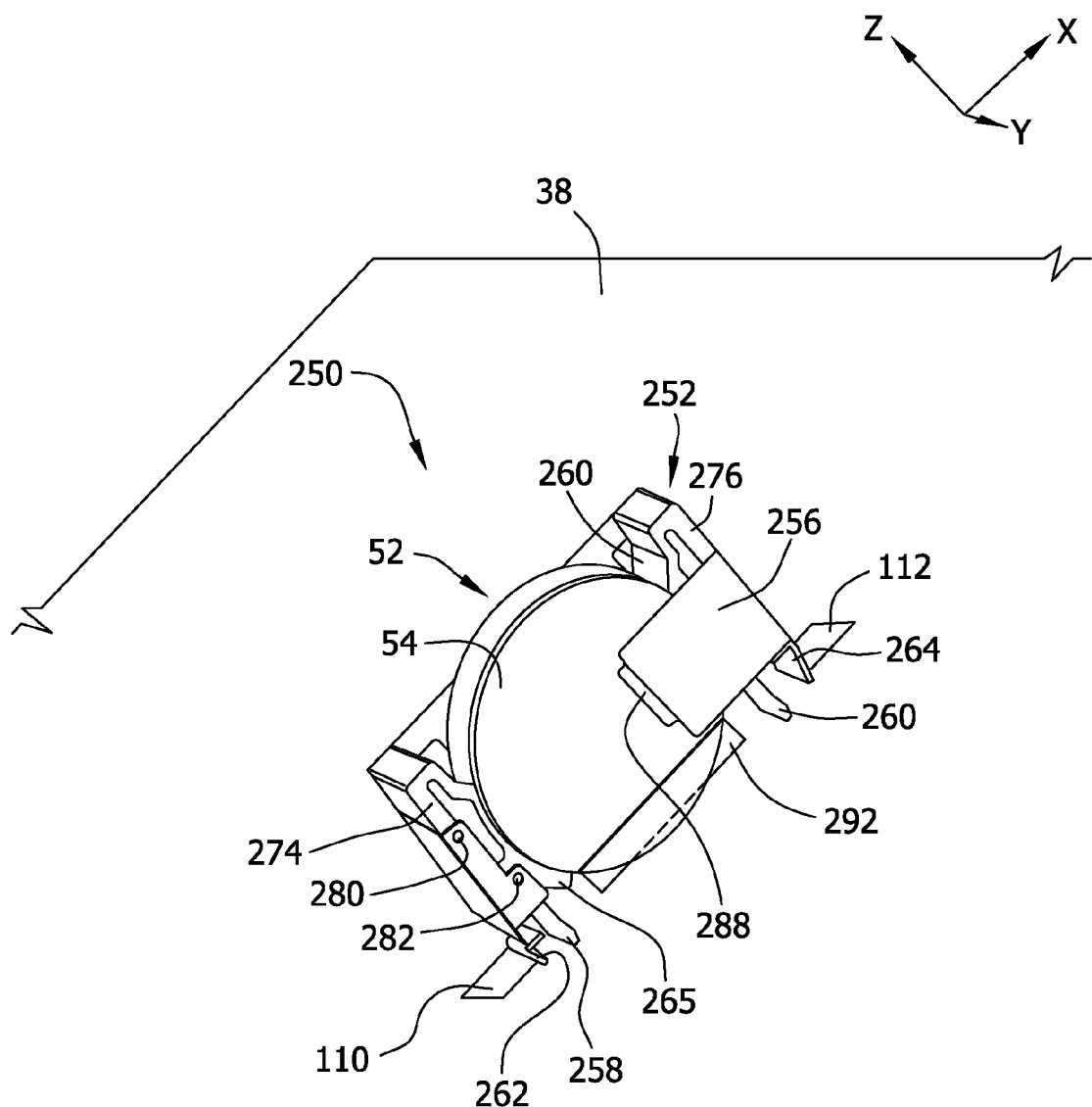
FIG. 8 is front perspective view of yet another alternative embodiment of a system for use in coupling a battery within an embedded system.
Figure 9:
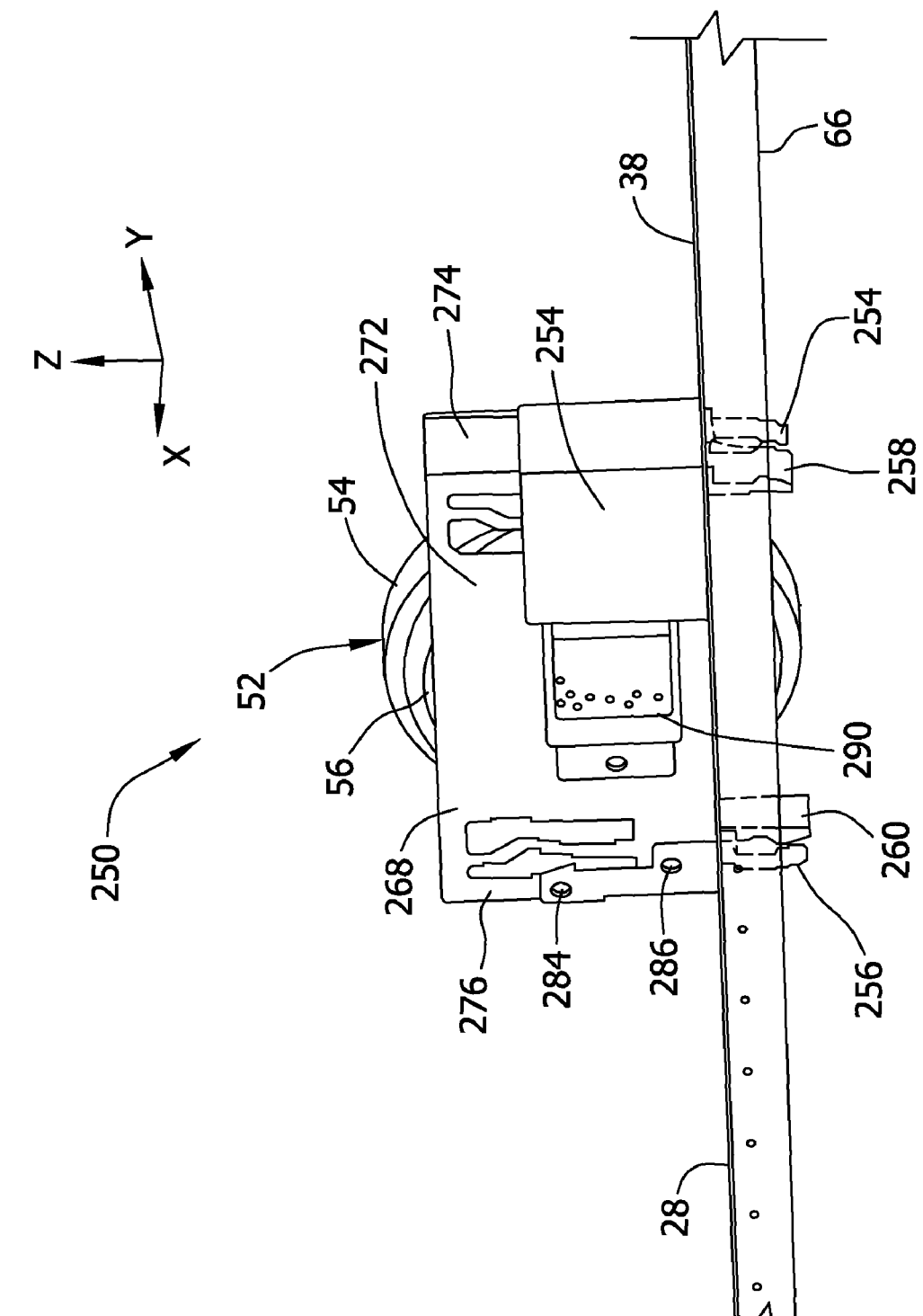
FIG. 9 is a rear perspective view of the system shown in FIG. 8.
Figure 10:
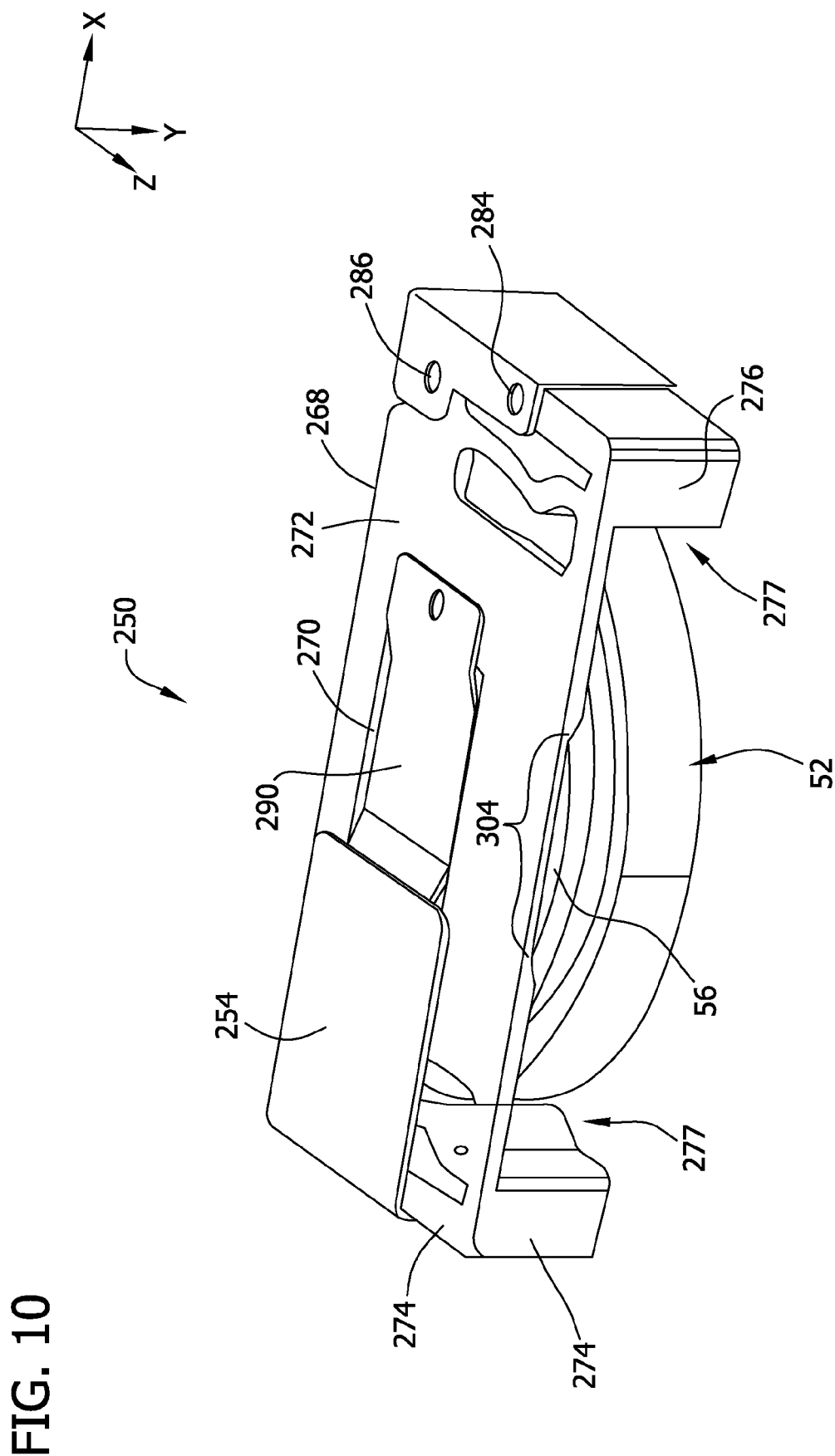
FIG. 10 is another perspective view of the system shown in FIG. 8.
Figure 11:
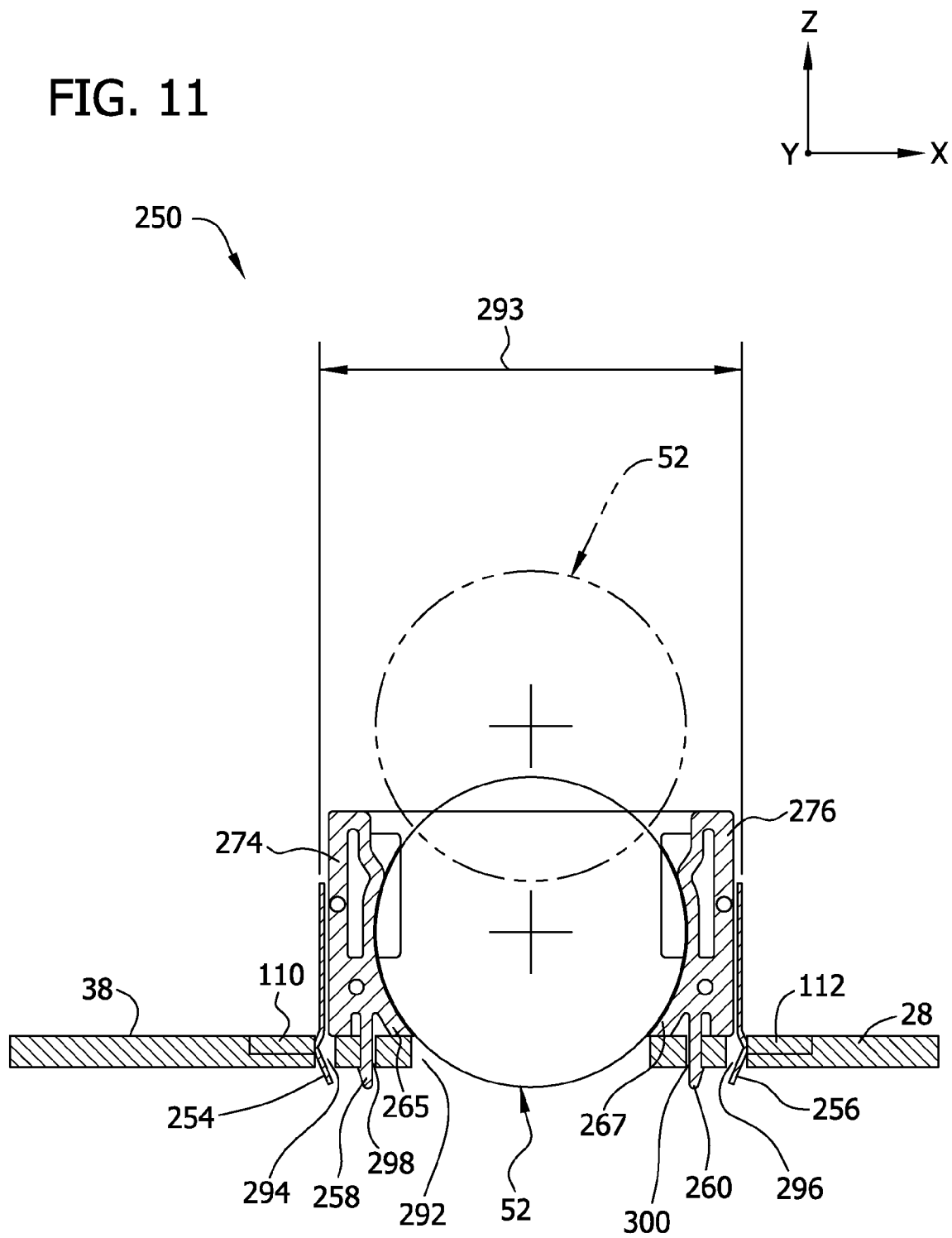
FIG. 11 is a cross-sectional view of the system shown in FIG. 8.

FIG. 8 is a front perspective view of an exemplary system 250 for use in coupling battery 52 within an embedded system (not shown). FIG. 9 is a rear perspective view of system 250 and FIG. 10 is yet another perspective view of system 250. FIG. 11 is a cross-sectional view of an embodiment of system 250. System 250 includes a battery holder 252, a contact member 254, a contact member 256, battery 52, and PCB 28. Battery holder 252 includes a plurality of prongs 258 and 260, contact member 254 includes a spring contact 262, and contact member 256 includes a spring contact 264. Battery holder 252 also includes a plurality of arms 265 and 267 that support battery 52 to facilitate reducing a likelihood of battery 52 tilting with respect to the Z-axis.

In the exemplary embodiment, prongs 258 and 260 extend substantially parallel from a main body 268 of battery holder 252, and battery holder 252 includes a slot 270 that extends through a back surface 272 of battery holder 252. Battery holder 252 also includes a plurality of side arms 274 and 276 that extend substantially perpendicularly from main body 164. Battery holder 252 includes a cavity 277 defined between arms 265 and 267. Contact member 254 is coupled within battery holder 252 at a plurality of contact points 280 and 282.

When contact member 256 is attached to battery holder 252, a protrusion 288 of contact member 256 extends into cavity 277. Protrusion 288 may be of any shape or size. More specifically, when contact member 254 is coupled to battery holder 252, a protrusion 290 of contact member 154 extends into cavity 277 via battery holder slot 270.

Battery holder 252 is fabricated from a nonconductive material. In the exemplary embodiment, a molding machine is used to fabricate battery holder 252.

In an alternative embodiment, battery holder 252 includes a first protrusion (not shown) at contact point 280 and a second protrusion (not shown) at contact point 282, and contact member 254 includes a first recess (not shown) that is substantially complementary to the first protrusion and contact member 254 includes a second recess (not shown) that is substantially complementary to the second protrusion. In another alternative embodiment, battery holder 252 includes a first protrusion (not shown) at contact point 284 and a second protrusion (not shown) at contact point 286, and contact member 256 includes a first recess (not shown) that is substantially complementary to the first protrusion and contact member 256 includes a second recess (not shown) that is substantially complementary to the second protrusion.

In yet another embodiment, battery holder 252 includes a first recess (not shown) at contact point 280 and a second recess (not shown) at contact point 282, and contact member 254 includes a first protrusion (not shown) that is substantially complementary to the first recess and contact member 254 includes a second protrusion (not shown) that is substantially complementary to the second recess. In another alternative embodiment, battery holder 252 includes a first recess (not shown) at contact point 284 and a second recess (not shown) at contact point 286, and contact member 256 includes a third protrusion (not shown) that is substantially complementary to the third recess (not shown) and contact member 256 includes a fourth protrusion (not shown) that is substantially complementary to the fourth recess (not shown).

Each contact member 254 and 256 is fabricated from a conductive metal. A stamping machine, in the exemplary embodiment, is used to fabricate contact members 254 and 256.

A plurality of holes 292, 294, 296, 298, and 300 are formed to extend through PCB 28. For example, a depth (not shown) of any of holes 294, 296, 298, and 300 is the same as thickness 59 of PCB 28. Hole 292 may be the same as hole 58 (shown in FIG. 2) or hole 172 (shown in FIG. 6). Hole 298 has a length substantially parallel to the X-axis that is longer than a thinnest portion of prong 258. Moreover, holes 300 and 298 each have dimensions that are substantially complementary to that of prongs 260 and 258. Further, holes 294 and 296 have dimensions that are substantially complementary to that of contact springs 254 and 256.

In the exemplary embodiment, battery 52 is positioned within a portion of battery holder 252 to establish contact between positive terminal 54 and protrusion 288, and via slot 270, between protrusion 290 and negative terminal 56. Moreover, prong 258 is extended through hole 298, prong 260 is extended through hole 300, contact spring 254 is extended through hole 294, and contact spring 256 is extended through hole 296. When prongs 258 and 260 are extended through holes 298 and 300, respectively, battery holder 252 is secured with respect to PCB 28 and supports battery 52. Moreover, when contact springs 254 and 256 are extended through holes 294 and 296, respectively, contact is established between contact spring 254 and contact pad 110, and contact is established between contact spring 256 and contact pad 112, and each respective spring 254 and 256 is then soldered to each respective pad 110 and 112. Additionally, when contact spring 254 extends through hole 294 and contact spring 256 extends through hole 296, a distance 293 between contact springs 254 and 256 ranges from about 0.80 inches to about 0.86 inches.

Battery holder 252 may have a varying thickness along the Y-axis to accommodate a raised portion of battery 52. For example, in the exemplary embodiment, a portion 304 of main body 268 is thinner than the remaining portion of main body 268. In another alternative embodiment, main body 268 of battery holder 252 has approximately the same thickness along the Y-axis. In another alternative embodiment, main body 268 of battery holder 252 has approximately the same thickness along the Y-axis, but may be of any dimension to accommodate battery 52 of various thicknesses.

In an alternative embodiment, protrusion 290 includes one or more projections, such as bumps, that face battery 52 and are in contact with battery 52 when protrusion 290 extends through slot 270. In another embodiment, contact member 256 includes one or more projections, such as bumps, that face battery 52 and that are in contact with battery 52. In yet another alternative embodiment, contact member 256 does not include protrusion 288 but does include one or more projections that contact battery 52. In an alternative embodiment, protrusion 290 is divided into two sections with a slit, allowing for dual, independent contact points.

FIG. 12 is a perspective view of an exemplary embedded system 400. In the exemplary embodiment, embedded system 400 includes a plane 402, such as a midplane or a backplane, and a plurality of modular boards with volumes 404 and 406. The board in volume 404 includes a PCB 408 and the board in volume 406 includes a PCB 410. Each volume 404 and 406 may house a single-board computer. PCB 28 (shown in FIG. 2) is an example of any of PCBs 408 and 410. Any of systems 50, 100, 150, 200, and/or 250 (shown in FIGS. 1-5 and 7-12) are sized to fit within either volume 404 and/or 406. The cross-sectional area on the xy plane of each PCB 408 and 410 is limited and defined by any of a Compact Peripheral Component Interface (CompactPCI) specification, Versa Module Eurocard (VME), and an Advanced Telecom Computing Architecture (AdvancedTCA) specification. In the exemplary embodiment, both the CompactPCI and AdvancedTCA specifications are provided by PCI Industrial Computer Manufacturers Group (PICMG) and VME specifications are provided by the VITA Standards Organization (VSO). Further, a depth, in the z-direction, of each volume 404 and 406 is controlled by one of CompactPCI, VME, and AdvancedTCA standards. For example, in the exemplary embodiment, vertical distances 68 and 72 (shown in FIG. 1) conform to one of the CompactPCI and AdvancedTCA standards. As another example, vertical distances 180 and 184 (shown in FIG. 5) conform to one of the CompactPCI, VME, and AdvancedTCA standards. In an alternative embodiment, embedded system 400 includes any number of industry standard or custom volumes.

In each embodiment illustrated herein, the use of dual contacts facilitates a more reliable connection to the respective battery. Moreover, the use of dual contacts and a recess in the cavity that accepts the battery, helps to keep prevents the battery from being inadvertently installed backwards. More specifically, a recess in the Y-axis is complementary to a raised portion of the battery, helping to prevent the insertion of the battery in the wrong orientation. Furthermore, in each embodiment, one contact is located along the Z-axis, for example, and the second contact is located at a significantly different orientation than the first contact, such that a battery installed incorrectly would not touch one of the two contacts. As a result, each respective battery holder is essentially "Murphy-proofed," such that the battery will only fit within the holder in one orientation, or at the least, in cases where the battery were forced into the holder, wouldn't touch both contacts.

Technical effects of the herein described methods and systems for coupling battery 52 include providing systems 50, 100, 150, 200, and 250, (shown in FIGS. 1-5 and 7-12) that comply with one of the CompactPCI, VME, and AdvancedTCA standards. A mounting depth of any battery 52 used with any of systems 50, 100, 150, 200, and 250 positions the battery such that it conforms to volumes defined in the specifications provided by one of the CompactPCI, VME, or AdvancedTCA standards. Other technical effects include a reduction in occupancy of the cross-sectional area by 67% by any of holes 58, 172, and 292. The reduction in the cross-sectional area by any of holes 58, 172, and 292 leaves more cross-sectional space on PCB 28 for attaching electrical devices to PCB 28.

Exemplary embodiments of a method and systems for coupling a battery are described above in detail. The systems are not limited to the specific embodiments described herein. For example, the systems may be used in combination with other electrical systems.

While various embodiments of the invention have been described, those skilled in the art will recognize that modifications of these various embodiments of the invention can be practiced within the spirit and scope of the claims.

What is claimed is:

1. A method for coupling a battery within an embedded system, said method comprising:
creating a hole extending through a printed circuit board (PCB), the PCB having a top surface and a bottom surface;
inserting a portion of the battery into the hole, wherein the hole is sized and oriented to position the battery substantially perpendicular relative to the top surface;
electrically coupling the battery to at least one contact;
attaching a first contact member to a first contact pad on the PCB;
attaching a second contact member to a second contact pad on the PCB;
establishing electrical contact between the first contact member and a positive terminal of the battery; and
establishing electrical contact between the second contact member and a negative terminal of the battery.

2. A method in accordance with claim 1, wherein said creating the hole comprises creating the hole with a length that is longer than an outer diameter of the battery.

3. A method in accordance with claim 1, wherein said creating a hole comprises creating the hole with a width that is wider than a thickness of the battery.

4. A method in accordance with claim 1, wherein said inserting a portion of the battery into the hole comprises placing a coin cell at least partially within the hole.

5. A method in accordance with claim 1, further comprising a limiting a distance between a surface of the PCB and a point on a circumference of the battery to conform to one of a Compact Peripheral Component Interconnect (Compact-PCI) standard, VME standard, and an Advanced Telecom Computing Architecture (AdvancedTCA) standard.

6. A method in accordance with claim 1, further comprising orienting the battery to be substantially oblique relative to the top surface of the PCB when the portion of the battery is within the hole.

7. A method in accordance with claim 1, wherein inserting a portion of the battery into the hole, further comprises inserting the battery into a battery holder that only receives the battery in a predetermined orientation.

8. A method in accordance with claim 1, further comprising supporting the battery by placing a cap onto a top of the battery.

9. A method in accordance with claim 1, further comprising:
   positioning a cap on a top of the battery; and
   embedding a portion of a conductive contact member within the cap.

10. A method for coupling a battery within an embedded system, said method comprising:
   creating a hole extending through a printed circuit board (PCB), the PCB having a top surface and a bottom surface;
   inserting a portion of the battery into the hole, wherein the hole is sized and oriented to position the battery substantially perpendicular relative to the top surface; and
   electrically coupling the battery to at least one contact;
   wherein said inserting the portion of the battery into the hole further comprises:
      positioning a portion of the battery in a cavity defined within a battery holder; and
      inserting a portion of the battery holder into the hole.

11. A method in accordance with claim 10, further comprising:
   connecting a contact member to the battery holder; and
   connecting the contact member to a terminal of the battery.

12. A method in accordance with claim 10, further comprising:
   connecting a contact member having a projection to the battery holder; and
   connecting the projection to a terminal of the battery.

13. A method in accordance with claim 10, further comprising fabricating the battery holder from a nonconductive material.

14. A method in accordance with claim 10, further comprising supporting the battery with a plurality of arms of the battery holder.

15. A method in accordance with claim 10, wherein said creating the hole comprises creating the hole with a length that is longer than an outer diameter of the battery.

16. A method in accordance with claim 10, wherein said creating a hole comprises creating the hole with a width that is wider than a thickness of the battery.

17. A method in accordance with claim 10, further comprising a limiting a distance between a surface of the PCB and a point on a circumference of the battery to conform to one of a Compact Peripheral Component Interconnect (Compact-PCI) standard, VME standard, and an Advanced Telecom Computing Architecture (AdvancedTCA) standard.

18. A method for coupling a battery within an embedded system, said method comprising:
   creating a hole extending through a printed circuit board (PCB), the PCB having a top surface and a bottom surface;
   inserting a portion of the battery into the hole, wherein the hole is sized and oriented to position the battery substantially perpendicular relative to the top surface;
   electrically coupling the battery to at least one contact;
   positioning a cap including a contact member on a top of the battery;
   connecting a contact receptacle to the PCB; and
   connecting the contact member to the receptacle.

* * * * *